United States Patent [19]

Hartman

[11] 3,771,217

[45] Nov. 13, 1973

[54] INTEGRATED CIRCUIT ARRAYS UTILIZING DISCRETIONARY WIRING AND METHOD OF FABRICATING SAME

[75] Inventor: Thomas Elton Hartman, Richardson, Tex.

[73] Assignee: Texas Instruments Incorporated, Dallas, Tex.

[22] Filed: Apr. 16, 1971

[21] Appl. No.: 134,903

Related U.S. Application Data

[63] Continuation of Ser. No. 765,870, Oct. 8, 1968, abandoned.

[52] U.S. Cl. .......................... 29/574, 29/577, 29/625

[51] Int. Cl. .......................... B01j 17/00

[58] Field of Search .......................... 29/577, 625, 627, 29/628, 574; 317/101 A, 101 CM, 101 CW

[56] References Cited

UNITED STATES PATENTS

| | | | |
|---|---|---|---|
| 3,312,871 | 4/1967 | Seki et al. | 29/577 |
| 3,354,360 | 11/1967 | Campagna et al. | 29/577 |
| 3,525,617 | 8/1970 | Bingham | 317/101 |
| 3,475,234 | 10/1969 | Kerwin et al. | 29/578 |
| 3,423,822 | 1/1969 | Davidson et al. | 29/577 |

*Primary Examiner*—Charles W. Lanham
*Assistant Examiner*—W. C. Tupman
*Attorney*—Michael A. Sileo, Jr.

[57] ABSTRACT

A plurality of spaced apart integrated circuits formed on a semiconductor substrate are provided with metal terminals extending through an insulating layer. A multilayer network of conductive strips is formed between the integrated circuits upon a first area of the insulating layer. The integrated circuits and the conductive strips are tested for preferred electrical characteristics. In response to the results of the testing, a unique pattern of discretionary leads are formed over a second area of the insulating layer. The discretionary leads connect selected portions of the multilayer network and the terminals of the integrated circuits to form an integrated circuit array.

14 Claims, 7 Drawing Figures

PATENTED NOV 13 1973

3,771,217

INTEGRATED CIRCUIT ARRAYS UTILIZING DISCRETIONARY WIRING AND METHOD OF FABRICATING SAME

This application is a continuation of Ser. No. 765,870, filed Oct. 8, 1968, now abandoned.

This invention relates to semiconductor devices, and more particularly to complex semiconductor circuitry in microminiature form.

Efforts are continuously being made to fabricate microminiature integrated circuit arrays having high component density in order to reduce the required number of integrated circuit packages per system. At the present state of the art, it is now possible to provide an entire system function on a single semiconductor slice by interconnecting a large number of integrated circuits formed on a single monocrystalline silicon slice having a diameter of perhaps one and one-half inches. Each of the integrated circuits providing a circuit function may contain perhaps 20 or more active and passive components. As the component density of a semiconductor slice increases, the complexity of the interconnections increases to the point where multilevel metallization is required.

Several different techniques have been developed to provide such multilevel high density integrated circuit arrays. In a technique termed the 100 percent yield approach, integrated circuit components are connected on a semiconductor slice with a first level of metallization to form a large number of unconnected circuit functions. A layer of insulation is formed over the first level of metallization, feedthrough holes are cut through the insulation according to a preselected fixed pattern, and at least one additional layer of metallization is applied to interconnect the circuit functions to provide a system function. When the fabrication is complete, testing of the circuit and system functions is carried out. If any of the circuit functions or the multilayer connections are faulty and cannot be repaired, the entire array is useless and must be discarded.

Due to the fact that a 100% yield of integrated circuits on a semiconductor slice is highly unlikely at the present state of the art, techniques utilizing "discretionary wiring" have been developed wherein an excess number of integrated circuits are formed on the semiconductor slice. Testing is conducted prior to the multilevel interconnection of the integrated circuits to form the system function, and only the "good" integrated circuits are connected by a unique pattern of discretionary leads. Such discretionary wiring eliminates the loss of an entire array due to the occurrence of a few bad integrated circuits, and thus greatly increases the yield of usable slices. A disclosure and description of one such discretionary winding technique is found in Electronics, Feb. 20, 1967, pp. 143–154; and in U.S. Pat. application Ser. No. 645,539, filed June 5, 1967.

While discretionary wiring techniques heretofore developed have provided a high level of integrated circuit density, problems have arisen due to the fact that the discretionary interconnection wiring layers are stacked directly upon the integrated circuits, thereby necessitating the use of a plurality of lead crossovers and feedthrough connections through the insulation layers. Feedthrough connections are subject to the fault of being "open," or failing to make the desired electrical contact between the multilevel areas. Such "open" connections may be caused by improper etching of the feedthrough holes completely through the insulating layers, or may be caused by an imperfect metal feedthrough connection being formed. Lead crossovers are subject to failure due to the occurrence of shorts between metal leads at different levels which are separated by imperfect oxide insulating layers.

Techniques have thus been developed in attempts to eliminate yield problems caused by defective feedthroughs and crossovers. For instance, fabrication techniques have been developed wherein an excess number of feedthrough connections are provided in a stacked multilevel array, with only valid feedthrough connections being utilized. Such techniques have, however, generally required the additional step of fabricating test pads for the feedthrough connections and have been generally limited to systems having a relatively high design redundancy, such as shift registers or the like. Further, such techniques have not provided the capability of repair of faulty integrated circuits or connections due to the stacked multilevel configuration of the arrays.

In accordance with the present invention, a predetermined network of conductive leads having an excess of crossover and feedthrough connections is formed on a semiconductor substrate on an area between spaced apart integrated circuits. The integrated circuits and the network of conductive leads are tested for preferred electrical characteristics, and then a unique pattern of discretionary leads is formed between the network and the integrated circuits to provide the desired system function.

In another aspect of the invention, a unique multilevel network of conductive leads is provided with a plurality of lead crossovers. Feedthrough connections are fabricated with the multilevel network by overlapping ends of the conductive leads over edge portions of the insulation separating the different levels of conductive leads. Additionally, a portion of the conductive leads of one level of the network are formed in nonlinear configurations in order to enable a planar change of direction or connection with conductive leads of the other level which extend in a different direction.

In accordance with another aspect of the invention, an oxide layer covering a semiconductor substrate is covered by an insulating layer not affected by oxide or metal etchant. This insulating layer is preferably silicon nitride. The layer of silicon nitride tends to passivate the substrate immediately beneath it in order to eliminate electrical degradation of the surrounding integrated circuits. Additionally, the layer of silicon nitride enables the formation of areas between the integrated circuitry wherein a fixed pattern conductive lead network and discretionary wiring may be disposed.

For a more complete understanding of the present invention and for further objects and advantages thereof, reference is now made to the following description taken in conjunction with the accompanying drawings, in which.

Figure 1:
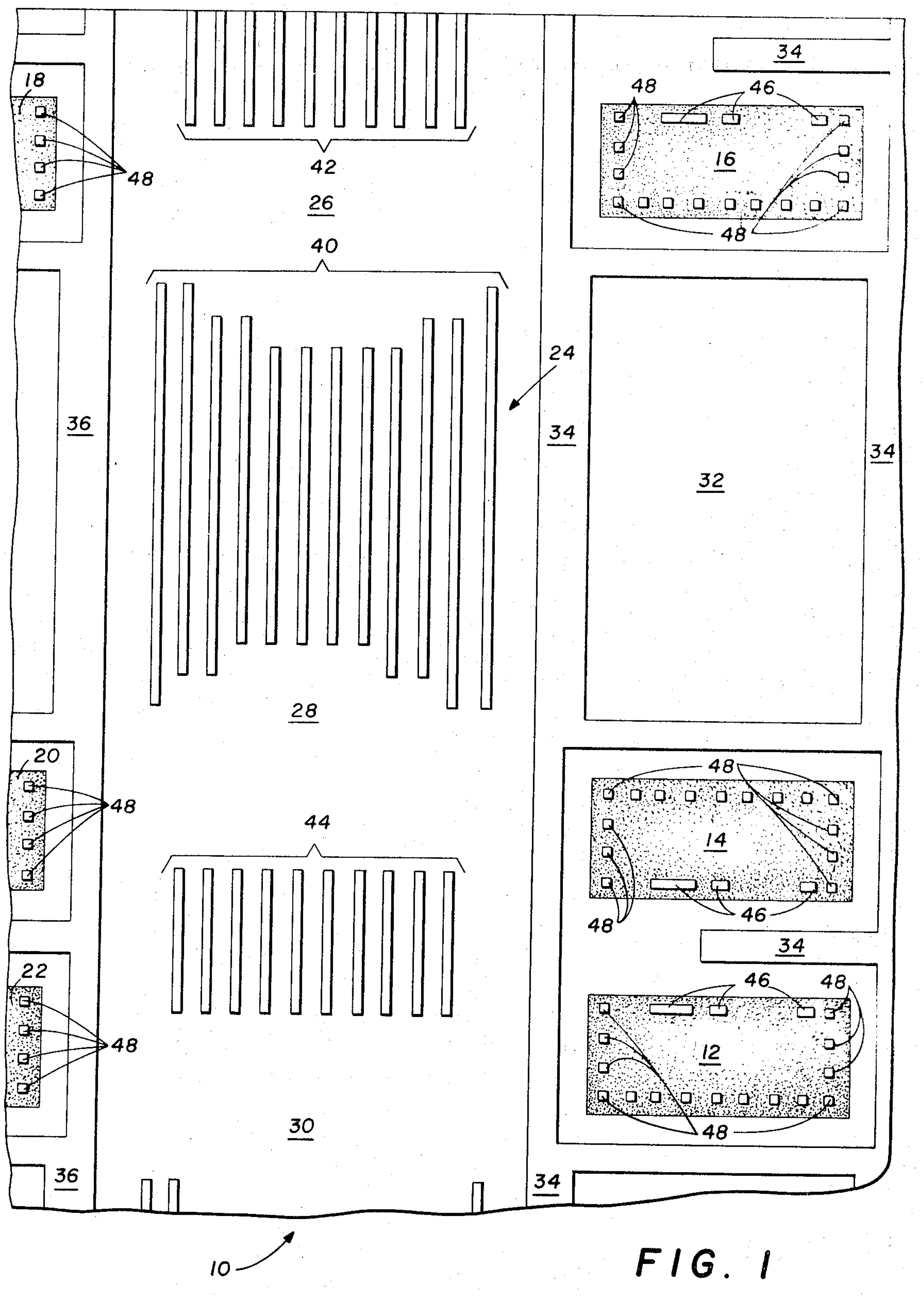
FIG. 1 is a top view of a portion of a complex integrated circuit array shown in the first metallization layer stage of assembly.

Referring to the figures, FIG. 1 illustrates a greatly enlarged portion of a silicon wafer, or slice, 10 which includes a number of integrated circuits 12, 14, 16, 18, 20 and 22. Each of the integrated circuits comprises a plurality of active and passive components to provide a circuit function. It will be understood that the illustrated integrated circuits are only a portion of the total system array formed on the semiconductor wafer 10. The integrated circuits are formed by conventional techniques such as epitaxial fabrication, multiple diffusion step fabrication or by any other suitable fabrication technique. For a more detailed description of the fabrication of integrated circuits, reference is made to Integrated Circuits by Baum et al., McGraw-Hill Book Company, 1965, pp. 127–165, and other pertinent pages therein.

The integrated circuits may utilize p-n junctions, or alternatively may utilize dielectric barriers. A number of components in addition to conventional transistors may be utilized in the integrated circuits illustrated, such as junction type field-effect transistors, insulated gate field-effect transistors, thin film devices and the like. While silicon is given as an example of semiconductor material used, other semiconductors such as germanium or the well-known III–V compounds may for many instances be equally suitable. The wafer 10 may comprise a polycrystalline, intrinsic or semi-insulating in character, instead of the monocrystalline intrinsic substrate illustrated.

The integrated circuits 12–22 are spaced apart to define the first area designated generally by the numeral 24 for the fabrication of a matrix of conductive leads in a manner subsequently to be described. The interconnection leads on each of the integrated circuits 12–22 have been omitted for simplicity of illustration. Additionally, areas 26, 28, 30 and 32 are provided on the semiconductor substrate to provide space for the fabrication of discretionary wiring according to the invention. As will be described in greater detail, each of the areas 24–32 and the upper surfaces of the integrated circuits 12–22 are covered by a suitable insulating material, which is preferably silicon nitride. A metal film pattern 34 extends around and between the integrated circuits 12 and 14 and also around the integrated circuit 16. Similarly, a pattern of metal film 36 extends about the integrated circuits 18, 20 and 22. The metal film patterns 34 and 36 are utilized as ground buses in the final assembly of the array.

A plurality of parallel metal strips 40 are formed over the area 24. A series of uniform metal strips 42 are spaced from the metal strips 40 to define the area 26. Similarly, uniform metal strips 44 are spaced apart from the metal strips 40 to define the area 28. The metal film patterns 34 and 36, as well as the metal strips 40, 42 and 44, are deposited upon the insulating layer of silicon nitride.

Each integrated circuit includes terminals 46 which extend from the semiconductor slice 10 up through the insulating layers covering the integrated circuits. Terminals 46 are connected in later assembly steps to ground and power leads. Each integrated circuit also includes a plurality of output and input terminals 48 which extend from the integrated circuits formed on the semiconductor substrate through the insulating layers covering the integrated circuits. Certain terminals 48 of each integrated circuit must be interconnected with other integrated circuit terminals to provide the desired system function.

Figure 2:
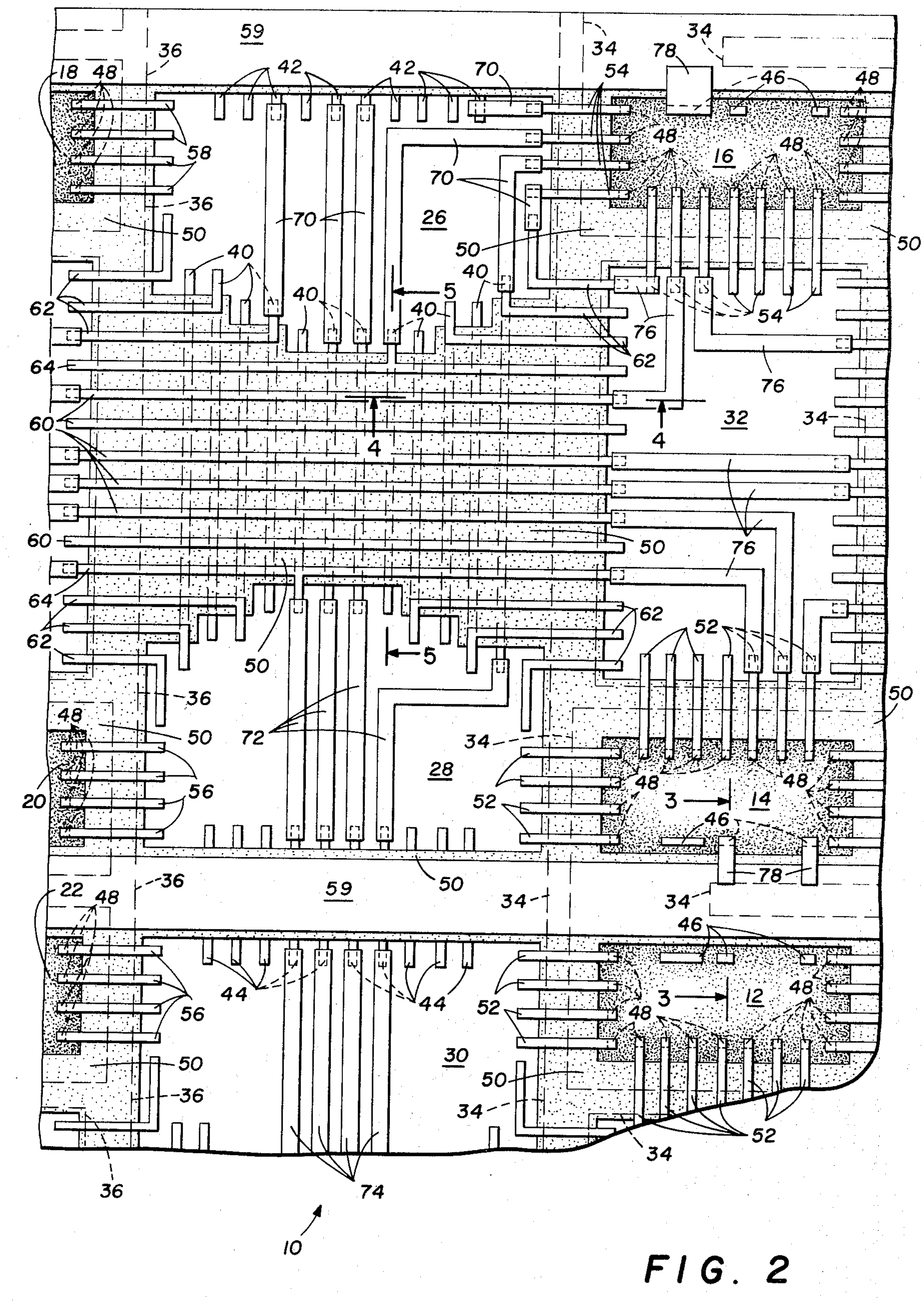
FIG. 2 is a top view of the integrated circuit array shown in FIG. 1 after the addition of two additional metallization steps.

Referring to FIG. 2, the final assembly of the integrated circuit array shown in FIG. 1 is illustrated. A pattern of insulation 50 is disposed over the first metallization layer shown in FIG. 1. Insulation layer 50 thus covers the metal film patterns 34 and 36, and also covers all but the end portions of the metal strips 40, 42 and 44. Insulation layer 50, however, does not cover the integrated circuits 12–22, nor the areas 26, 28, 30 and 32.

A second layer of metallization is then applied which comprises a first group of metal strips 52 which extend from the terminals 48 of integrated circuits 12 and 14 across the insulating layer 50 to respective ones of the areas 28, 30 and 32. The metal strips 52 enable connections to be made to the terminals 48 of the integrated circuits by the discretionary wiring to be later described. Similarly, a number of metal strips 54 extend from the terminals 48 of the integrated circuit 16 over the insulating layer 50 to areas 26 and 32. A number of uniform metal strips 56 extend from the terminals 48 of integrated circuits 20 and 22 across the insulating layer 50 to areas 28 and 30. Likewise, a plurality of parallel uniform metal strips 58 extend from the integrated circuit 18 across the insulating layer 50 to area 26. A pair of broad metal strips 59 are formed across the insulating layer 50 for use as power buses.

Another group of second level metallization strips 60 are linearly formed over the insulating layer 50 directly on top of the parallel metal strips 40*a–l*. Several L-shaped metal strips 62 are formed at each corner of the rectangle generally defined by the strips 60. Two T-shaped metal strips 64 are also disposed over the insulating layer 50. It will thus be seen that a complex multilevel network of conductive leads is formed in the area 24 between the integrated circuits 12–22. This network provides a plurality of crossovers due to the fact that the upper level metal strips 60, 62 and 64 extend generally perpendicularly to the lower level metal strips 40. Feedthrough connections between the upper and lower levels of the network are made by overlapping the ends of the metal strips 62 and 64 over the insulating layer 50 into contact with ones of the metal strips 40. As small feedthrough holes need not be defined through the insulating layer in accordance with the invention, the feedthrough connections made at the edges of the insulating layer 50 are much less likely to have faults therein. In effect, the areas 26–32 function as extremely large feedthrough connection holes which need not be precisely formed.

After the fabrication of the multilevel network according to the fixed pattern, a series of tests are run on the integrated circuits and the network to test preselected electrical characteristics. As will be later described, the results of the testing is examined by a computer and a unique pattern of discretionary wiring is computed and fabricated upon the areas 26, 28, 30 and 32.

Specifically, a number of discretionary connection leads 70 are formed directly upon the layer of insulation covering area 26. Discretionary wiring leads 72 are formed on the area 28, while discretionary wiring leads 74 are formed on area 30. Similarly, discretionary wiring leads 76 are formed upon the insulation covering area 32. These discretionary wiring leads interconnect selected terminals 48 of the integrated circuits with one another through the multilevel network of leads. Discretionary wiring connections 78 are also formed between selected ones of the terminals 46 of the integrated circuits and the buses 59. The application of the discretionary leads to the array interconnects the array to provide the desired system function.

Figure 3:
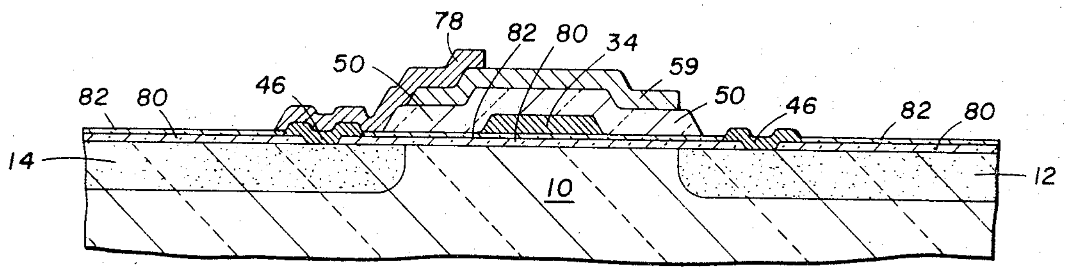
FIG. 3 is a cross-sectional view taken generally along the sectional lines 3—3 of the circuit shown in FIG. 2.

FIG. 3 illustrates a cross-sectional view of a portion of the array shown in FIG. 2 taken generally along the section lines 3—3. Like numbers will be hereafter used for like and corresponding parts of previous FIGURES. A layer of insulation 80, such as silicon oxide, extends over the surface of the semiconductor substrate 10. A layer of silicon nitride 82 is disposed over the insulating layer 80. Metal terminals 46 extend through the oxide layer 80 and the nitride layer 82 to contact the integrated circuit areas 12 and 14. As will later be described, the silicon nitride layer 82 is not attacked by etchants used to etch the silicon oxide or metal layers, in order that multilevel structure may be fabricated upon the insulating layer 80. The metal film 34 is disposed upon the silicon nitride layer 82 and is covered by a portion of the insulating layer 50. The metal bus 59 is disposed over the insulating layer 50 and is in electrical contact with the discretionary wiring connection 78. The discretionary wiring connection 78 connects the terminal 46 of the integrated circuit 14 with the metal bus 59.

Figure 4:
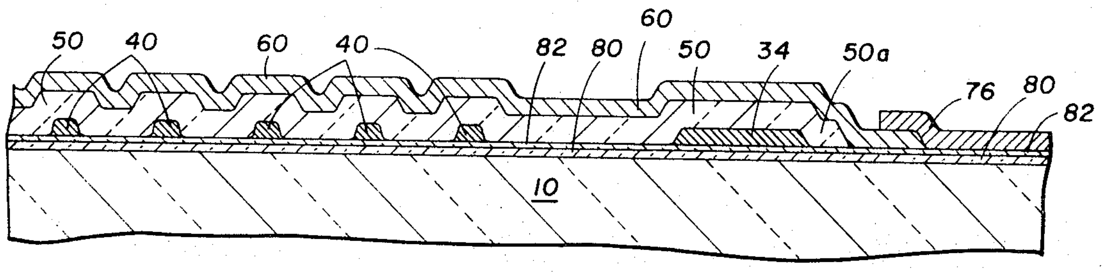
FIG. 4 is a cross-sectional view taken generally along section lines 4—4 on the circuit shown in FIG. 2.

FIG. 4 illustrates a cross section of the multilevel network of FIG. 2 taken generally along the section lines 4—4. The semiconductor substrate 10 is covered by the silicon oxide insulating layer 80, which in turn is coated with the silicon nitride layer 82. The first level metal strips 40 extend along the upper surface of the silicon nitride coating 82, as does the metal film 34. The layer of insulation 50 covers the metal strips 40 and the metal film 34. The insulating layer 50 terminates at the position designated at 50*a* to define the area 32 illustrated in FIGS. 1 and 2. The second level metallization strip 60 extends over the top of the insulation layer 50 and laps over the end point 50*a* of the insulating layer 50 to extend into contact with the discretionary lead 76. The multilevel network may thus be seen to provide a plurality of lead crossovers in this section.

Figure 5:
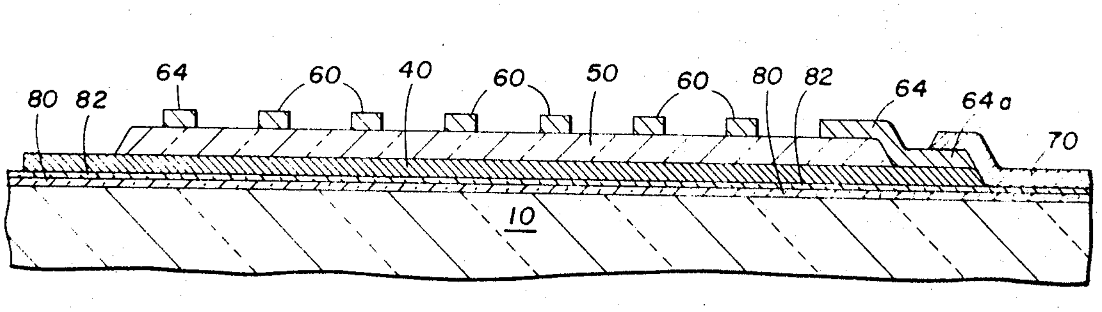
FIG. 5 is a sectional view taken generally along the section lines 5—5 on the circuit shown in FIG. 2.

FIG. 5 illustrates another section of the network shown in FIG. 2, taken generally along the section lines 5—5. The silicon oxide layer 80 extends over the surface of the semiconductor wafer 10, with the silicon nitride layer 82 being disposed thereover. A lower level metal strip 40 extends over the silicon nitride layer 82. The insulating layer 50 extends over the majority of the length of the metal strip 40, with only the end portions of the metal strip 40 being exposed. A plurality of the upper metallization level metal strips 60 are symmetrically spaced over the insulating layer 50. The pair of second level T-shaped leads 64 are disposed along the edge portions of the insulating layer 50, with one of the T-shaped leads 64 lapping over the end of the insulating layer 50 for direct electrical contact with the metal strip 40 at the area designated as 64*a*. This provides a feedthrough connection between the upper and lower levels of the multilevel network. A discretionary wiring lead 70 makes direct electrical contact with the metal leads 64 and 40. It will be understood that others of the leads 70 shown in FIG. 2 directly contact only the lower level leads 40.

Figure 6:
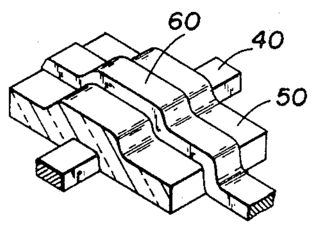
FIG. 6 is a perspective view of a crossover constructed in accordance with the present invention.

FIG. 6 illustrates a perspective view of a typical lead crossover between the upper and lower levels of the multilevel network. The insulating layer 50 separates the lower metal strip 40 from the upper metal strip 60. The ends of the metal strips extend beyond the insulating layer 50, to provide ease of contact with discretionary wiring leads and also to provide for ease of rework.

Figure 7:
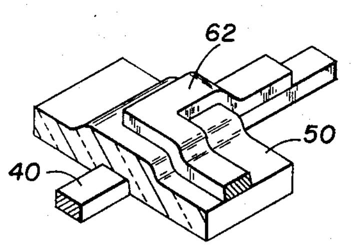
FIG. 7 is a perspective view of a feedthrough connection made in accordance with the present invention.

FIG. 7 illustrates a perspective view of a typical feedthrough connection according to the invention. An L-shaped upper level metallization strip 62 laps over the end of the insulating layer 50 for direct electrical contact with the lower level metal strip 40. The provision of feedthrough connection made in an exposed, relatively large feedthrough connection area provides yield increases and allows rework of faulty connections.

As previously noted, any conventional technique for fabricating the various insulating and conductive layers of the microminiature array may be used. It will be understood that the circuits illustrated in FIGS. 1–7 are chosen merely for illustrative purposes, and that any one of a number of different systems may be constructed with the present invention.

In an exemplary method of fabrication of the instant array, the integrated circuits 12–22 are formed on the semiconductor substrate 10 by epitaxial growth or multiple diffusion steps. A layer of insulation material 80, such as silicon oxide, is grown over the surface of the semiconductor substrate 10 by a suitable technique such as the conventional silane process. A photo-resist layer is applied over the insulation layer 80 by conventional technique and is patterned by exposure through a suitable photo-mask having a preselected, fixed pattern. This fixed pattern exposes areas overlying the terminals of the integrated circuit areas. The photo-resist layer is exposed by light projected through the photo-mask and then is developed by spraying the semiconductor substrate 10 with a suitable developing solution. The semiconductor slice 10 is then immersed in a suitable etching solution, such as buffered hydrofluoric acid, to etch openings through the insulating layer 80 to expose the terminals of the integrated circuit areas 12–22. The remaining photo-resist is then stripped from the semiconductor substrate 10.

A uniform layer of metal, such as aluminum, is deposited by a suitable technique such as evaporation. Photo-resist is applied, exposed, developed and etched in the well-known manner such that terminals 46 and 48 extend through the oxide layer 80 for contact with the semiconductor substrate 10.

A thin layer of silicon nitride 82 is then disposed over the oxide layer 80, but is processed such that the metal terminals 46 and 48 are exposed. Silicon nitride is not attacked by agents commonly used in integrated circuit techniques to etch either insulation or metal. A uniform layer of metal such as aluminum is deposited over the silicon nitride layer 82. A photo-resist layer is then applied over the metal layer and is exposed through a suitable fixed pattern photo-mask in the manner previously described. The photo-resist is then developed and etched in the conventional manner to define the metal film patterns 34 and 36, and the metal strips 40, 42 and 44. At this stage of fabrication, the array will appear as shown in FIG. 1.

The layer of insulation 50, which may be silicon oxide, is deposited over the surface of the array shown in FIG. 1. Photo-resist is applied and a suitable fixed mask is then utilized to expose the photo-resist in the manner previously described. Etchant is applied in order to etch out areas 26, 28, 30 and 32 down to the silicon nitride layer 82. The silicon nitride layer 82 is not reactive with the etchant agent, and therefore provides an insulating layer upon which discretionary wiring may be subsequently laid.

Another layer of metal such as aluminum is deposited over the array. Utilizing another fixed mask and conventional etching techniques, the metal layer is etched to form the metal strips 52–58 and the upper level metal strips 60–64 of the multilevel network. At this stage of fabrication of the array, a plurality of unconnected integrated circuits are formed, along with the unconnected multilevel network of lead crossovers and feedthrough connections.

Each of the terminals and leads extending from the integrated circuits, and each of the conductive leads of the multilevel network are then tested for preferred electrical characteristics. The testing of the terminals and leads is conducted in generally the same manner as the testing described and disclosed in U.S. Pat. application Ser. No. 645,539, previously identified. The testing is accomplished by engaging the leads with a multiprobe structure, certain of the probes being provided with electrical input signals and others of the probes detecting output signals. The detected output signals provide an indication of the electrical characteristics of active electronic components such as transistors, and also provides indications of shorts or open conditions of the conductive leads. The testing steps of the invention, of course, are not limited to mechanical probing, but may be conducted by other devices such as thermal or field scanning systems.

In the testing of the semiconductor wafer 10, the wafer is precisely placed and is optically aligned with the multiprobe system. The slice 10 is then automatically indexed with respect to the multiprobe system until all of the points of interest have been tested. The data with respect to the validity of each of the integrated circuits and the conductive leads are stored on magnetic tape. This magnetic tape is fed into a routing program in a digital computer which is programmed to generate a slice map showing the locations of good and bad active components and conductive leads.

This slice map is operated upon by the digital computer to generate a digital routing pattern of interconnections so that the good integrated circuits are connected with good feedthrough and crossover connections to form the desired system function. The resulting digital routing pattern is converted into analog signals by a digital-to-analog converter. The analog signals control the deflection and intensity circuitry of a cathode-ray tube. The cathode-ray tube beam is passed through a lens system such that a narrow light beam is directed upon a photographic film or plate.

By controlling the deflection and intensity of the light beam from the cathode-ray tube, a mask image is generated on the film due to the incremental exposure of small spots on the film. The system utilized to perform the testing and mask generation described is termed a multilevel interconnection generator and is disclosed and described in more detail in the previously identified Feb. 20, 1967 article in Electronics.

After the film has been exposed in accordance with the desired discretionary wiring interconnections, the film is developed. The semiconductor slice 10 is deposited with a thin metal film such as molybdenum-gold layers and a photo-resist material applied over the metal film. The developed film is then utilized as a mask to expose the photo-resist to create the desired unique pattern of discretionary wiring. The photo-resist is then exposed and developed and the excess metal film is removed by a suitable etchant which attacks the molybdenum-gold, but not the aluminum used for the fixed pattern leads. Suitable etchants for this purpose are moderately concentrated nitric acid and cyanide etchants. The resulting unique pattern of discretionary wiring connections 70, 72, 74, 76 and 78 result. The array shown in FIG. 2 is thus connected to provide the desired system function.

The present invention thus provides a multilevel microminiature integrated circuit array in which excellent yield is virtually guaranteed due to the provision of a high number of prefabricated crossover and feedthrough connection circuits. Although substantial space on the semiconductor wafer is utilized by the discretionary wiring and the prefabricated multilevel network of the invention, the increase in yield will offset the space requirements. Furthermore, it is within the purview of the state of the art to construct integrated circuits considerably smaller than the current practice. Due to the stacking of multilayer connections upon integrated circuits in previously developed arrays, it has been impractical to make the integrated circuits as small as the capability of the art allowed. However, with use of the present invention, the integrated circuits may be constructed as small as possible with present day techniques.

A much higher number of crossovers than feedthrough connections are fabricated in the multilevel network of the invention in order to insure an adequate number of valid crossovers and to insure that a satisfactory discretionary wiring pattern may be generated. Relatively complex computing programs must be utilized to compute the discretionary wiring layouts of the invention, but such costs will be outweighed by the excellent yields provided by the invention.

Advantages are provided by the provision of a large number of the connections exposed for ease of maintenance and rework. Additionally, because the majority of the interconnections of the array are disposed away from the integrated circuitry, any rework or maintenance done upon the interconnections will not destroy or damage the integrated circuits.

The use of silicon nitride by the invention tends to passivate the semiconductor surface, thereby eliminating electrical degradation of the array caused by ion migration in the silicon oxide. The use of the silicon nitride also allows the subsequent oxide and metal etching steps to be utilized without etching away the insulation. The use of the relatively large exposed areas for the fabrication of feedthrough connections is advantageous in that precise uniformity of small feedthrough holes is not necessary. The larger holes can tolerate some nonuniformity by merely changing the length of certain of the metal strips on the array.

The use of the L-shaped metal strips of the prefabricated multilevel network enables changes of direction of the conductive strips. The use of the T-shaped metal leads enables substantial flexibility of connection in that three different directions of connection are possible. It will of course be understood that other configurations of metal strips will be found advantageous for use with the present multilevel network. Whereas the present invention has been described with respect to a specific embodiment thereof, it will be understood that various changes and modifications may be suggested to one skilled in the art, and it is contemplated that the appended claims will encompass such changes and modifications as fall within the true scope of the invention.

What is claimed is:

1. A method of fabricating an integrated circuit system having a multilevel conductor zone selectively interconnecting electronic circuits through monolevel connection zones, comprising the steps of:

a. selectively forming a plurality of spaced electronic circuits on one major surface of a support substrate;

b. selectively forming a first group of spaced elongated conductors on said major surface of said substrate adjacent to said electronic circuits so that said first conductors have their ends respectively terminating in first and second spaced monolevel connection zones;

c. selectively applying a layer of insulation over said first conductors and said major surface of said substrate so as to expose said first and second connection zones and the ends of said first conductors terminating therein and to expose additional spaced areas of said major surface of said substrate to produce spaced monolevel third and fourth connection zones;

d. selectively forming a second group of spaced elongated conductors on said insultaing layer in overlying relationship with respect to said first conductors to produce said multilevel conductor zone, said second conductors having their ends selectively terminating within spaced monolevel connection zones;

e. selectively forming a third group of spaced elongated conductors on said major surface of said substrate selectively within said monolevel connection zones so that at least one of said third conductors has one of its ends selectively connected to one end of one of said first and second conductors respectively within a monolevel connection zone and its other end selectively coupled to one of said electronic circuits; and f. selectively connecting the other end of said one of said first and second conductors to another electronic circuit through another of said third conductors in another monolevel connection zone so as to produce said integrated circuit system.

2. The method of claim 1 wherein a first selected portion of said second conductors are selectively formed so as to extend between and terminate within said third and fourth monolevel connection zones.

3. The method of claim 2 wherein a second selected portion of said second conductors are selectively formed so as to extend between and terminate within said first and third monolevel connection zones.

4. The method of claim 3 wherein a third selected portion of said second conductors are selectively formed so as to extend between and terminate within said first and fourth monolevel connection zones.

5. The method of claim 2 wherein a fourth selected portion of said second conductors are selectively formed so as to extend between and terminate within said second and third monolevel connection zones.

6. The method of claim 5 wherein a fifth selected portion of said second conductors are selectively formed so as to extend between and terminate within said second and fourth monolevel connection zones.

7. The method of claim 2 wherein one conductor of said first portion of said second conductors is formed so as to have an intermediate portion that extends between the main body of said one conductor and said first monolevel connection zone.

8. The method of claim 2 wherein one conductor of said first portion of said second conductors is formed so as to have an intermediate portion that extends between the main body of said one conductor and said second monolevel connection zone.

9. The method of claim 1 wherein said second conductors are formed so as to be substantially transverse to said first conductors.

10. The method of claim 1 and further including the steps of:

a. selectively forming a fourth group of spaced elongated conductors on said insulation layer in overlying relationship with respect to said one surface of said substrate before said third conductors are formed so that said fourth conductors have one of their ends selectively connected to said electronic circuits and their other ends selectively terminating within said monolevel connection zones; wherein b. said other ends of said third conductors are selectively coupled to said electronic circuits through respective ones of said fourth conductors.

11. The method of claim 1 and further including the step of:

a. selectively forming a thin layer of conductive material over said one surface of said substrate around and between said electronic circuits and remote from said monolevel connection zones and said multilevel conductor zone prior to the selective application of said insulation layer for providing ground buses for said integrated circuit system.

12. The method of claim 1 and further including the steps of:

a. selectively forming at least one elongated power conductor electrically insulated from said first, second and third conductors, said monolevel connection zones and said multilevel conductor zone; and b. selectively forming a fifth group of spaced elongated conductors and selectively connecting said fifth conductors between said electronic circuits and said power conductor for providing power to said electronic circuits.

13. The method of claim 1 and further including the step of:

a. selectively applying a thin layer of silicon nitride over said insulating layer prior to the formation of said second conductors for providing etch-resistant protection for said underlying insulation layer and said first conductors during the subsequent steps in the method.

14. The method of claim 1 and further including the steps of:

a. testing said electronic circuits and said first and second conductors prior to the formation of said third conductors; and b. selecting a preferred interconnection pattern between said electronic circuits and said first and second conductors prior to the formation of said third conductors; wherein c. said third conductors are selectively formed in said preferred interconnection pattern.

* * * * *